(12) United States Patent
Yang et al.

(10) Patent No.: US 11,356,631 B2
(45) Date of Patent: Jun. 7, 2022

(54) IMAGE SENSOR ROW DRIVER NEGATIVE SUPPLY CONNECTIONS

(71) Applicant: SHENZHEN GOODIX TECHNOLOGY CO., LTD., Shenzhen (CN)

(72) Inventors: Chao Yang, San Diego, CA (US); Matthew Powell, San Diego, CA (US); Dazhi Wei, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 132 days.

(21) Appl. No.: 17/066,468

(22) Filed: Oct. 8, 2020

(65) Prior Publication Data

US 2022/0116562 A1    Apr. 14, 2022

(51) Int. Cl.
*H04N 5/378*     (2011.01)
*H03M 1/12*      (2006.01)
*H04N 5/363*     (2011.01)

(52) U.S. Cl.
CPC .............. *H04N 5/378* (2013.01); *H03M 1/12* (2013.01); *H04N 5/363* (2013.01)

(58) Field of Classification Search
CPC ............... H04N 5/378; H04N 5/23227; H04N 5/23241; H04N 5/363; H03M 1/12
See application file for complete search history.

(56) References Cited

U.S. PATENT DOCUMENTS

| | | | |
|---|---|---|---|
| 8,093,541 B2* | 1/2012 | Chen | H04N 5/3591 |
| | | | 348/307 |
| 10,785,432 B2* | 9/2020 | Lim | H04N 5/3594 |
| 2009/0302359 A1* | 12/2009 | Chen | H04N 5/3591 |
| | | | 257/292 |
| 2017/0127004 A1* | 5/2017 | Uemura | H04N 5/37457 |
| 2019/0230302 A1* | 7/2019 | Lim | H04N 5/3594 |
| 2021/0337119 A1* | 10/2021 | Nishino | H04N 5/341 |

* cited by examiner

*Primary Examiner* — Nicholas G Giles
(74) *Attorney, Agent, or Firm* — Kilpatrick Townsend & Stockton LLP

(57) ABSTRACT

An image sensor includes image sensor cells, each configured to generate an image signal in response to control signals. The image sensor also includes an ADC to receive the image signals of the image sensor cells, and a first driver to generate one or more first control signals for a first image sensor cell, where the first driver includes a first negative supply terminal. The image sensor also includes a first multiplexor to selectively connect the first negative supply terminal of the first driver to one of a plurality of power supply nodes, and a second driver to generate one or more second control signals for a second image sensor cell, where the second driver includes a second negative supply terminal. The image sensor also includes a second multiplexor to selectively connect the second negative supply terminal of the second driver to one of the power supply nodes.

20 Claims, 4 Drawing Sheets

IMAGE SENSOR ROW DRIVER NEGATIVE SUPPLY CONNECTIONS

TECHNICAL FIELD

The subject matter described herein relates to image sensors, and more particularly to image sensors having low read noise.

BACKGROUND

Image sensor performance is affected by resolution of ADCs used to convert sensed data voltages to digital signals. Circuit techniques for implementing compact ADCs is needed in the art.

SUMMARY

One inventive aspect is an image sensor. The image sensor includes a plurality of image sensor cells, each configured to generate an image signal in response to a plurality of control signals. The image sensor also includes an analog to digital converter (ADC) configured to receive the image signals of the image sensor cells, and a first driver configured to generate one or more first control signals for a first image sensor cell, where the first driver includes a first negative supply terminal. The image sensor also includes a first multiplexor configured to selectively connect the first negative supply terminal of the first driver to one of a plurality of power supply nodes, and a second driver configured to generate one or more second control signals for a second image sensor cell, where the second driver includes a second negative supply terminal. The image sensor also includes a second multiplexor configured to selectively connect the second negative supply terminal of the second driver to one of the plurality of power supply nodes.

In some embodiments, the plurality of power supply nodes includes and a first negative supply node and a second negative supply node, where the voltage of the first negative supply node is less than or equal to the voltage of a ground node, and where the voltage of the second negative supply node is less than or equal to the voltage of the ground node.

In some embodiments, the first multiplexer is configured to connect the first negative supply terminal of the first driver to the first negative supply node while the second multiplexer connects the second negative supply terminal of the second driver to the second negative supply node.

In some embodiments, the first multiplexer is configured to connect the first negative supply terminal of the first driver to the first negative supply node while the first driver causes an image signal of a first image sensor cell to be provided to the ADC.

In some embodiments, the first multiplexer is configured to connect the first negative supply terminal of the first driver to the first negative supply node while the first driver causes an image signal of a first image sensor cell to be provided to the ADC, and is configured to connect the first negative supply terminal of the first driver to the second negative supply node while the first driver causes the first image sensor cell to be reset.

In some embodiments, the plurality of power supply nodes further includes the ground node.

In some embodiments, the first multiplexer is configured to connect the first negative supply terminal of the first driver to the ground node while the first driver transitions an output from a negative voltage value to a positive voltage value to cause an image signal of a first image sensor cell to be provided to the ADC.

In some embodiments, the voltage of the first negative supply node is equal to the voltage of second negative supply node.

In some embodiments, the second negative supply node is electrically connected to an external capacitor.

In some embodiments, the image sensor also includes a switch configured to selectively connect the first negative supply node to the second negative supply node.

Another inventive aspect is a method of using an image sensor. The method includes, with each of a plurality of image sensor cells, generating an image signal in response to a plurality of control signals, with an analog to digital converter (ADC), receiving the image signals of the image sensor cells, and with a first driver, generating the control signals for a first image sensor cell, where the first driver includes a first negative supply terminal. The method also includes, with a first multiplexor, selectively connecting the first negative supply terminal of the first driver to one of a plurality of power supply nodes, and with a second driver, generating the control signals for a second image sensor cell, where the second driver includes a second negative supply terminal. The method also includes, with a second multiplexor, selectively connecting the second negative supply terminal of the second driver to one of the plurality of power supply nodes.

In some embodiments, the plurality of power supply nodes includes and a first negative supply node and a second negative supply node, where the voltage of the first negative supply node is less than the voltage of a ground node, and where the voltage of the second negative supply node is less than the voltage of the ground node.

In some embodiments, the method also includes, with the first multiplexer, connecting the first negative supply terminal of the first driver to the first negative supply node while the second multiplexer connects the second negative supply terminal of the second driver to the second negative supply node, and with the first multiplexer, connecting the first negative supply terminal of the first driver to the second negative supply node while the second multiplexer connects the second negative supply terminal of the second driver to the first negative supply node.

In some embodiments, the method also includes, with the first multiplexer, connecting the first negative supply terminal of the first driver to the first negative supply node while the first driver causes an image signal of a first image sensor cell to be provided to the ADC.

In some embodiments, the method also includes, with the first multiplexer, connecting the first negative supply terminal of the first driver to the second negative supply node while the first driver causes the first image sensor cell to be reset.

In some embodiments, the plurality of power supply nodes further includes the ground node.

In some embodiments, the method also includes, with the first multiplexer, connecting the first negative supply terminal of the first driver to the ground node while the first driver transitions an output from a negative voltage value to a positive voltage value to cause an image signal of a first image sensor cell to be provided to the ADC.

In some embodiments, the voltage of the first negative supply node is equal to the voltage of second negative supply node.

In some embodiments, the second negative supply node is electrically connected to an external capacitor.

In some embodiments, the method also includes, with a switch, selectively connecting the first negative supply node to the second negative supply node.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
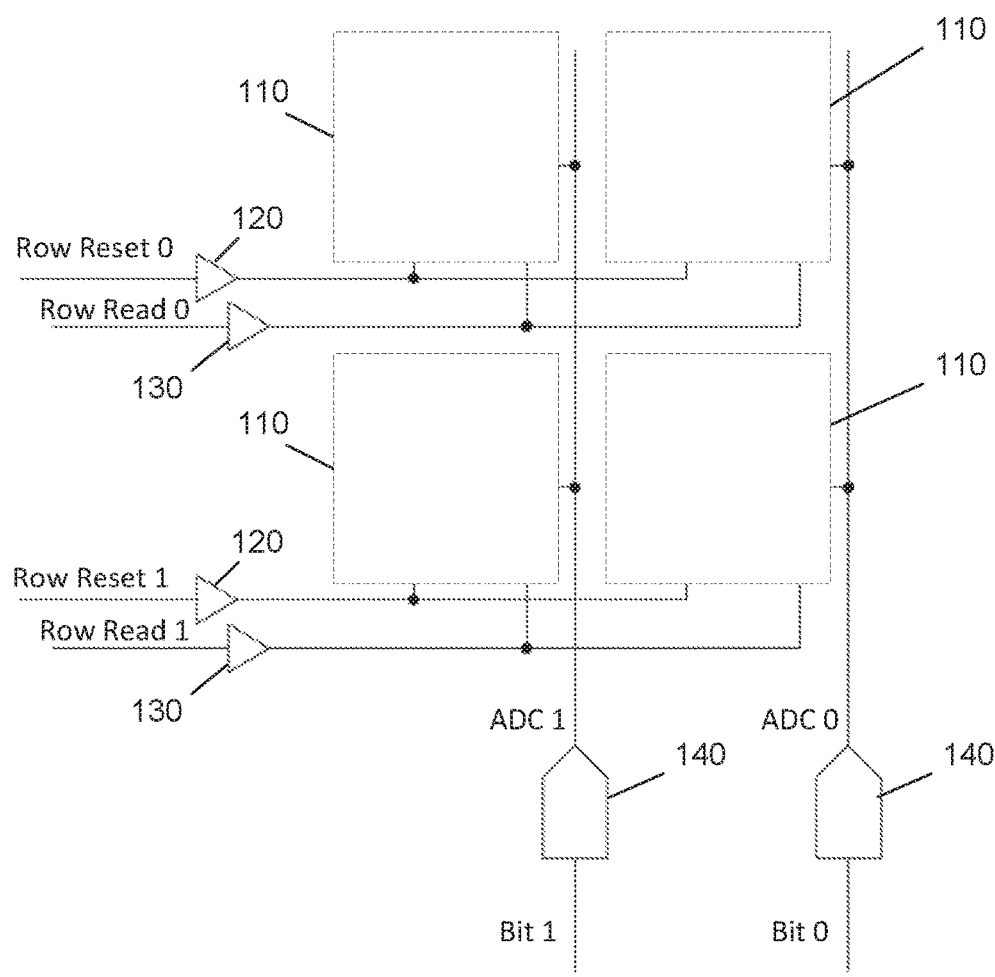
FIG. 1 is a schematic diagram of an embodiment of an image sensor array.

Circuit features of image sensor circuits providing high resolution image read data are described herein with reference to certain embodiments. Some of the features are illustrated in the figures. For example, the figures illustrate TX drivers and their negative supply connection system which drive the image cells of the array. The TX drivers have their negative supplies selectably connectable to each of three negative supplies. The negative supply connectability allows for negative supply connection management resulting in improved noise isolation performance. FIG. 1 is a schematic diagram of an embodiment of an image sensor array. FIGS. 2-5 illustrate a sensor array cell, its TX drivers, their negative supply connection operation to isolate noise.

FIG. 1 is a schematic diagram of an embodiment of an image sensor array 100. Image sensor array 100 includes four image sensor cells 110, row reset buffers 120, row read buffers 130, and ADCs 140. Image sensor array 100 is an example only. Image sensor arrays having different features may alternatively be used.

Each of the image sensor cells 110 includes a photodiode, one or more switches configured to selectively receive signals from the row reset and row read buffers connected thereto. In response to the received signals, the switches cooperatively cause each of the image sensor cells 110 to accumulate charge with a storage capacitance according to an amount of light incident thereon, to deliver an image data signal to the one of the ADCs 140 based on the accumulated charge, to initialize the input of one of the ADCs 140, and to initialize the charge storage capacitance.

The ADCs 140 are configured to generate digital words corresponding with the analog voltage at their respective input nodes. Accordingly, the digital words generated by the ADCs correspond with and are a digital representation of the charge accumulated by the image sensor cells 110.

The charge stored in the image sensor cells 110 is a result of accumulated charge conducted by the respective photodiodes, as understood by those of skill in the art, between a time when the charge storage capacitance of image sensor cells 110 are initialized and a time when the image data signal is received by one of the ADCs 140.

The rows of image sensor cells 110 are successively read, and the digital words generated by the ADCs 140 are successively stored in a memory (not shown) to generate image data representing an image sensed by the entire sensor array 100, as understood by those of skill in the art. Furthermore, image data representing multiple images may be successively sensed by the sensor array 100, and stored in the memory.

Figure 2:
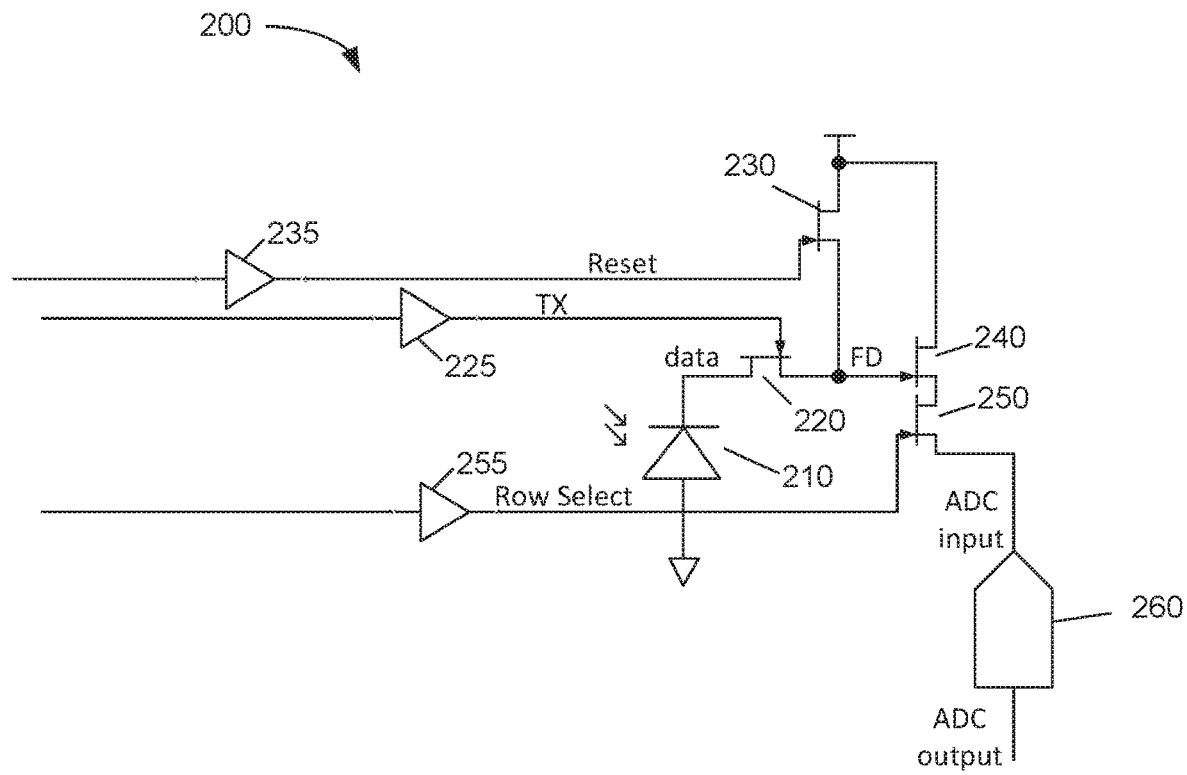
FIG. 2 is a schematic diagram of an embodiment of an image sensor array cell connected to peripheral circuitry.

FIG. 2 is a schematic diagram of an embodiment of an image sensor array cell 200 connected to peripheral circuitry. The image sensor array cell includes photodiode 210, Access transistor 220, reset transistor 230, source follower transistor 240, and ADC transistor 250. The peripheral circuitry includes ADC 260, reset driver 235, TX driver 225, and row select driver 255.

Figure 3:
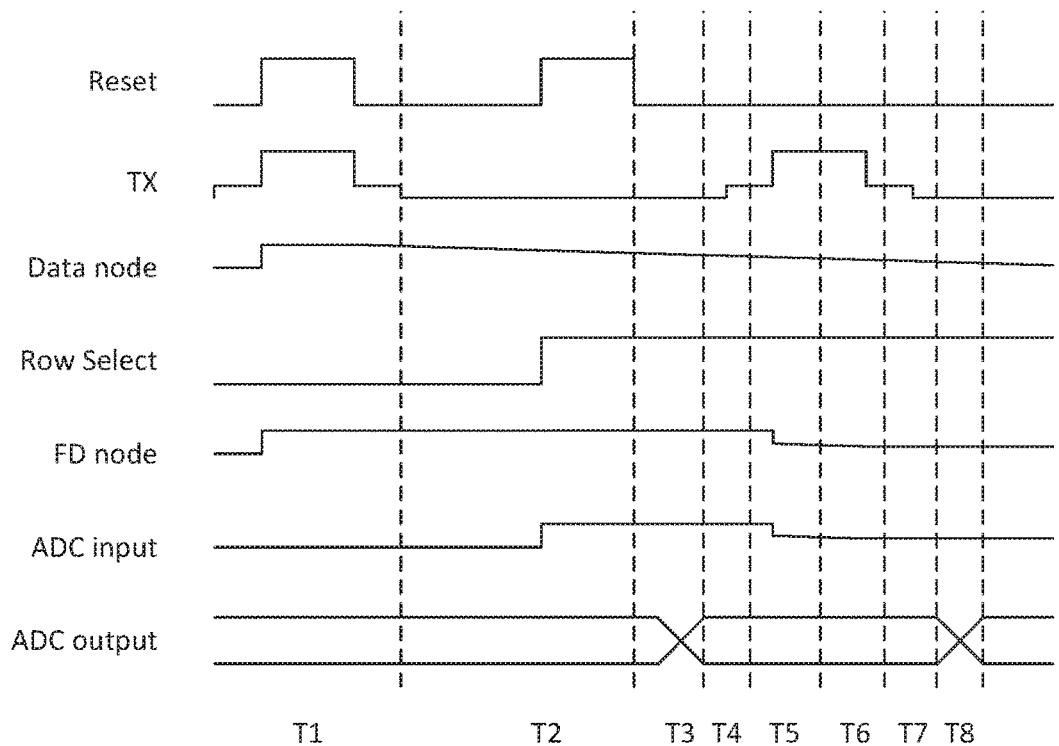
FIG. 3 is a timing diagram illustrating functionality of the image sensor array cell of FIG. 2.

FIG. 3 is a timing diagram illustrating functionality of the image sensor array cell of FIG. 2.

During time T1, the data node of phototransistor 210 is reset. Time T1 may be considered a cell reset time, during which the data node of each of the image sensor array cells in a particular row of an image sensor is reset.

During time T1, reset driver 235 causes the reset node to be high, and TX driver 225 causes the TX node to be high. The voltage value of the high voltage at the TX node may, for example, be positive, and greater than a ground voltage. In addition, the row select driver 255 causes the row select node to be low. Because the row select node is low, ADC transistor 250 is not conductive, and the ADC input node is isolated from activity occurring within the image sensor array cell.

During time T1, in response to the reset node being high, reset transistor 230 is conductive. In addition, in response to the TX node being high, the access transistor 220 is conductive. Because the reset transistor 230 is conductive the voltage at node FD is equal to the voltage of the power supply node connected to the drain of reset transistor 230. In addition, because the access transistor 220 is conductive, the voltage at the data node of the phototransistor 210 is also equal to the power supply voltage (Vdd).

At the end of time T1, reset driver 235 causes the reset node to be low, and TX driver 225 causes the TX node to be low. The voltage value of the low voltage at the TX node may, for example, be negative, less than the ground voltage. In response to the reset node being low, reset transistor 230 is nonconductive, and in response to the TX node being low, access transistor is nonconductive. In some embodiments, at the end of time T1, reset driver 235 does not cause the reset node to be low, and reset transistor 230 remains conductive.

Because at least access transistor 220 is nonconductive, the data node of phototransistor 210 is no longer held at the power supply voltage. As understood by those of skill in the art, photodiode 210 conducts charge according to the light it receives. Accordingly, starting with the end of time T1, the voltage at the data node of phototransistor 210 is reduced by photodiode 210 according to the light received by photodiode 210.

During time T2, the ADC input node is reset. Time T2 may be considered an ADC reset or zero or initialization time, during which the ADC input nodes of the image sensor are reset or initialized or zeroed to a starting value as part of or in preparation for a read operation for reading data from the pixels of a particular row of the image sensor.

During time T2, the reset driver 235 causes the reset node to be or to remain high, and the row select driver 255 causes the row select node to be high. In addition the TX driver 225 causes the TX node to be low. Because the TX node is low, access transistor 220 is not conductive, and the data node of the phototransistor 210 is isolated from activity occurring within the image sensor array cell.

During time T2, in response to the reset node being high, reset transistor 230 is conductive. In addition, in response to the row select node being high, the ADC transistor 250 is also conductive. Because the reset transistor 230 is conductive, the voltage at node FD is equal to the power supply voltage. Because the voltage at node FD is equal to the power supply voltage, source follower transistor 240 is conductive.

Because both source follower transistor 240 and ADC transistor 250 are conductive, source follower transistor 240 and ADC transistor 250 conduct charge from the power supply connected to the drain of source follower transistor 240 to the ADC input node. In response, the voltage at the ADC input node approaches a value equal to the power supply voltage minus a threshold voltage value Vt of source follower transistor 240, as understood by those of skill in the art.

In alternative embodiments, at the end of time T2, the reset driver 235 causes the reset node to become low, and the row select driver 255 causes the row select node to become low. In response to the reset node being low, reset transistor 230 becomes nonconductive. In some embodiments, the resent select node becomes low, and the ADC transistor 250 also becomes nonconductive. In some embodiments, at the end of time T2, row select driver 255 does not cause the row select node to be low, and ADC transistor 250 remains conductive.

In some embodiments, the pixel reset time of a particular row of the image sensor occurs during or near the time the ADC initialization time occurs as part of or in preparation for reading data from the pixels of another row of the image sensor.

During time T3, ADC 260 generates a first digital voltage D0 encoding the voltage at the ADC input node. Accordingly, first digital voltage D0 encodes the value Vdd−Vt.

During time T4, the TX driver 225 causes the voltage at the TX node to become equal to the ground voltage. In alternative embodiments, the TX driver 225 does not change the voltage at the TX node at time T4, such that the voltage at the TX node remains at the voltage value less than the ground voltage.

During time T5, the TX driver 225 causes the voltage at the TX node to become high, and the row select driver 255 either causes the row select node to become high or continues to cause the row select node to be high. In addition, the reset driver 235 causes the voltage at the reset node to remain low, such that the reset transistor 230 remains nonconductive.

In response to the voltage at the TX node becoming high, access transistor 220 becomes conductive. Because access transistor 220 is conductive and reset transistor 230 is nonconductive, the voltage at node FD becomes equal or substantially equal to the voltage (Vdata) at the data node of the phototransistor 210.

In addition, in response to the row select node being high, row select transistor 250 is or becomes conductive. Furthermore, because ADC transistor 250 is conductive, a current sink (not shown) connected to the ADC input node causes the voltages at the ADC input node and the source node of the source follower transistor 240 to drop. In some embodiments, the current sink is part of the ADC 260. In some embodiments, the current sink is not part of the ADC 260, but is connected elsewhere to the ADC input node.

As understood by those of skill in the art, the current sink causes the voltages at the ADC input node and the source node of the source follower transistor 242 drop to a value equal to the voltage at the node FD minus a threshold voltage value Vt of source follower transistor 240.

Accordingly, during time T5, the voltage at the ADC input node becomes equal to Vdata−Vt.

During time T6, the TX driver 225 causes the voltage at the TX node to become equal to the ground voltage, and the row select driver 255 causes the row select node to become low.

In response to the voltage at the TX node becoming the ground voltage, access transistor 220 becomes nonconductive, and the data node becomes isolated from the node FD. In addition, in response to the voltage at the row select node becoming low, the ADC input node becomes isolated from the source follower transistor 240.

During time T7, the TX driver 225 causes the voltage at the TX node to become equal to the low voltage less than the ground voltage.

During time T8, ADC 260 generates a second digital voltage D1 encoding the voltage at the ADC input node. Accordingly, second digital voltage D1 encodes the value Vdata−Vt.

A controller, not shown, may receive both first and second digital voltages D0 and D1, and may determine the image data of the illustrated read operation as a difference between first and second digital voltages D0 and D1.

Figure 4:
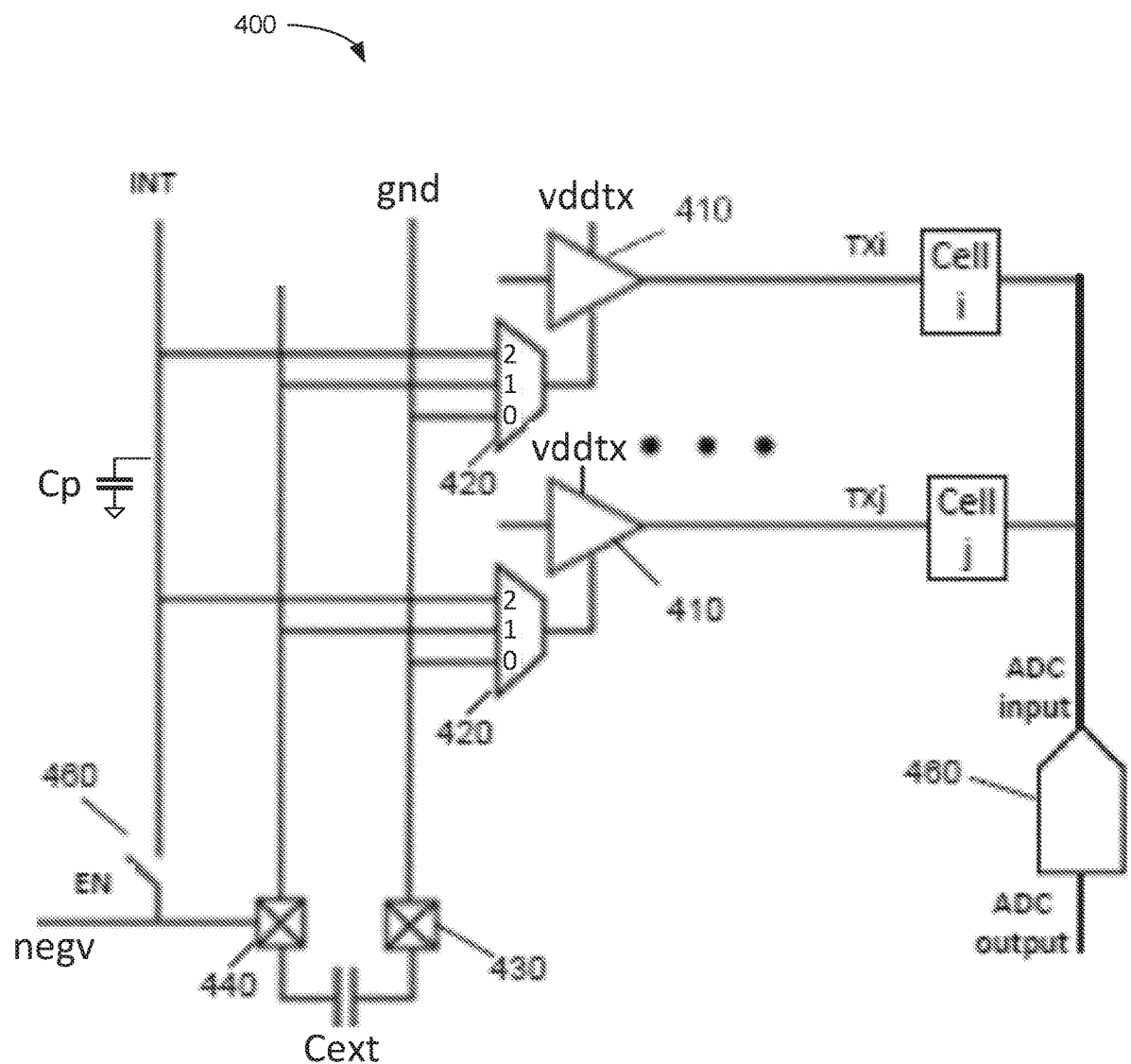
FIG. 4 is a schematic diagram of an embodiment of TX drivers and their negative supply connection system.

FIG. 4 is a schematic diagram of an embodiment of TX drivers and their negative supply connection system. As shown, the TX drivers respectively provide TXi and TXj signals for image array sensor cells i and j, which provide image data to ADC 460 at the ADC input node. Certain functionality of the negative supply connection system comprising multiplexer's 420, bond pads 430 and 440, capacitor Cext, internal negative supply at node INT, external negative supply node EXT, and switch 460, is described herein is used with TX drivers 410 and first and second image sensor cells i and j. In addition, negative supply connection systems having similar or identical features as those discussed herein may be used with other drivers for other types of image sensor cells, as understood by those of skill in the art.

As shown, negative supply node negv is connected to external negative supply node EXT through bond pad 440.

Furthermore, the negative supply terminal of each TX driver 410 is connected to an output of a multiplexer 420. In addition, each multiplexer has a first data input connected to the ground supply node gnd, a second data input connected to external negative supply node EXT, and a third data input connected to internal negative supply node INT. Furthermore, each multiplexer has a control input (not shown) which is used to select which of the data inputs is electrically connected with the multiplexer output.

As discussed in further detail elsewhere herein, each row of image sensor cells experiences a reset operation and a read operation. In some embodiments, a controller (not shown) causes the multiplexer 420 for a particular row experiencing a read operation to connect the negative supply terminal of the TX driver 410 for the particular row to the external negative supply node EXT during the read operation. In addition, the controller causes the multiplexer for certain or all rows not experiencing a read operation to connect the negative supply terminal of the TX driver 410 for the certain or all rows to the internal negative supply node INT during the read operation of the particular row.

The parasitic capacitance of the internal negative supply node INT is represented in FIG. 4 as parasitic capacitor Cp. In embodiments of image sensors having many rows of image sensor cells, the value of parasitic capacitor Cp may be large. For example in some embodiments the value of parasitic capacitor Cp may be about 10 nF. The value of parasitic capacitor Cp is large at least partly because the internal negative supply node INT is connected to the TX nodes of many rows of the image sensor through the multiplexers 420 and TX drivers 410.

In this embodiment, the negative voltage at external negative supply node EXT is generated by any suitable voltage source. The negative voltage generated by the voltage source is provided to external capacitor Cext, which is connected to each of external negative supply node EXT and ground supply node gnd through bond pads 440 and 430, respectively.

In some embodiments, cells i and j, TX drivers 410, and multiplexers 420 are integrated in a single integrated circuit package. In addition, external capacitor Cext may external to the integrated circuit package, and may be connected to external negative supply node EXT and to internal negative supply node INT through pins of the package, as understood by those of skill in the art.

In this embodiment, switch 460 is configured to connect internal negative supply node INT with external supply node EXT according to signal EN.

Figure 5:
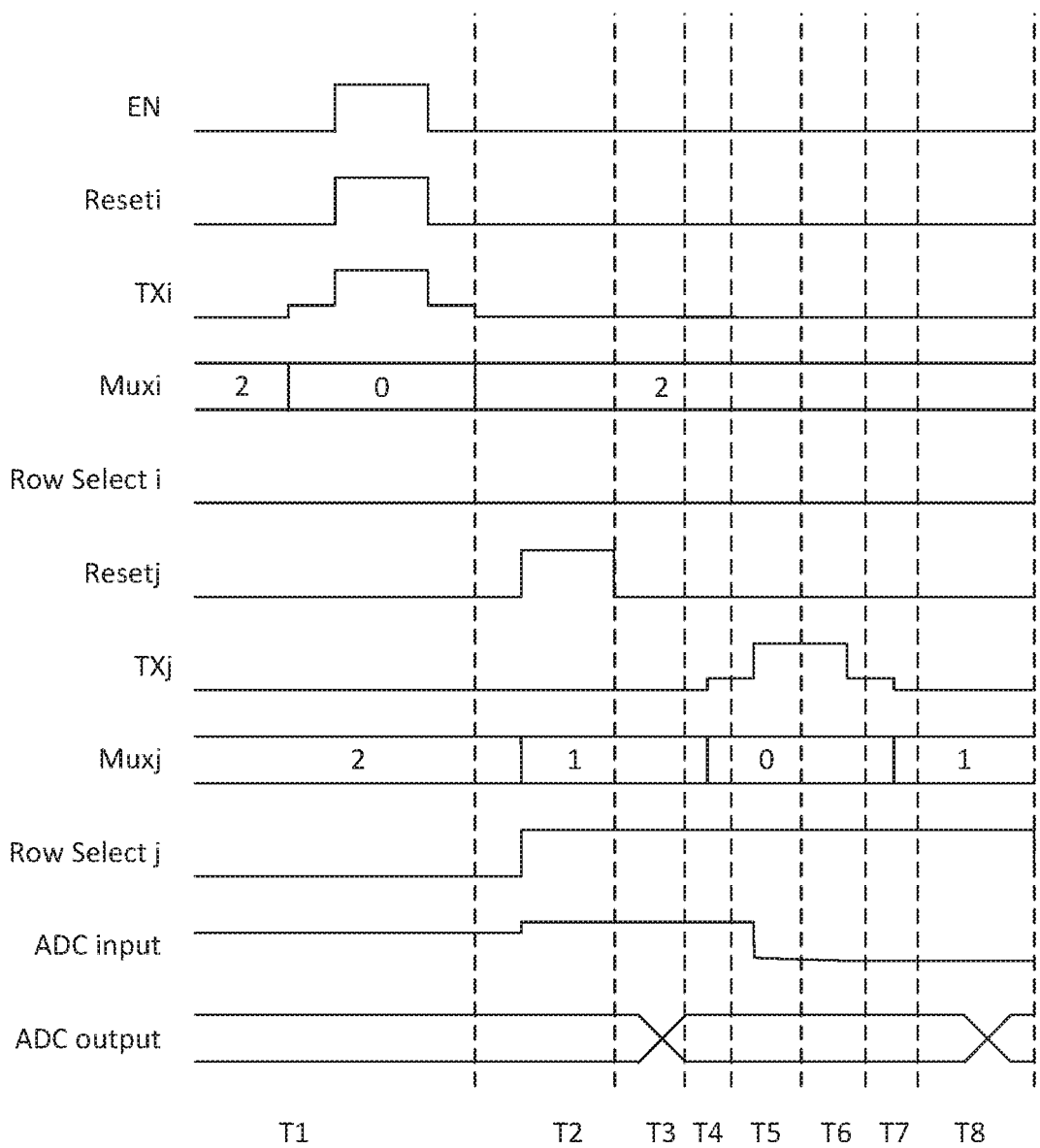
FIG. 5 is a timing diagram illustrating functionality of the TX drivers and their negative supply connection system of FIG. 4.

FIG. 5 is a timing diagram illustrating functionality of the TX drivers and their negative supply connection system illustrated in FIG. 4 while driving a first image sensor cell i and a second image sensor cell j, which are instantiations of the image sensor cell in FIG. 2, where first and second image sensor cells i and j are in different pixel rows of the image sensor. In some embodiments, a number of intervening pixel rows are between the respective pixel rows of first and second image sensor cells i and j. In this embodiment, the pixel reset time of the row of first image sensor cell i occurs while the ADC initialization time occurs as part of or in preparation for a reading data from the row of second image sensor cell j. The time T1 illustrated in FIG. 5 corresponds with time T1 of FIG. 3 with respect to the pixel reset time of the first image censor cell i. The times T2-T8 illustrated in FIG. 5 respectively correspond with like labeled times T2-T8 of FIG. 3 with respect to the ADC input initialization and reading operations of the second image censor cell j.

During a time not illustrated and prior to the times illustrated in FIG. 5, second image sensor cell j experiences a pixel reset time similar or identical to that illustrated and discussed with respect to time T1 of FIG. 3. In addition, during a time not illustrated and after the times illustrated in FIG. 5, first image sensor cell i experiences an ADC initialization and pixel read operation similar or identical to that illustrated and discussed with respect to times T2-T8 of FIG. 3.

During time T1, the multiplexor 420 connected to the TX driver 410 for cell i receives a first control signal causing the negative supply terminal of the TX driver 410 for cell i to be connected to ground supply gnd instead of the internal negative supply node INT. The controller may generate the first control signal because the row of cell i is not experiencing a pixel read operation during time T1.

During time T1, the multiplexor 420 connected to the TX driver 410 for cell j receives a second control signal causing the negative supply terminal of the TX driver 410 for cell j to be connected to the internal negative supply node INT. The controller may generate the second control signal because the row of cell j is not experiencing a pixel read operation during time T1.

During time T1, the data node of the phototransistor of cell is reset because reseti, the reset node of cell i and TXi, the TX node of cell i are high, as discussed above with reference to FIGS. 2 and 3. In addition, during time T1, enable signal EN causes switch 460 to connect internal negative supply node INT with external supply node EXT.

During time T1, enable signal EN causes switch 460 to isolate internal negative supply node INT from external supply node EXT.

During time T2, the ADC input node of cell j is initialized because reseti, the reset node of cell j and row select j, the row select node of cell j, are high, as discussed above with reference to FIGS. 2 and 3. In addition, during time T2, enable signal EN causes switch 460 to isolate internal negative supply node INT from external supply node EXT.

Furthermore, during time T2, the multiplexor 420 connected to the TX driver 410 for cell j receives a control signal causing the negative supply terminal of the TX driver 410 for cell j to be connected to the external negative supply node EXT, for example, as a result of the row of cell j experiencing or being prepared to experience a pixel read operation.

During time T3, during time T3, the multiplexor 420 connected to the TX driver 410 for cell i receives a control signal causing the negative supply terminal of the TX driver 410 for cell i to be connected to the internal negative supply node INT, and the multiplexor 420 connected to the TX driver 410 for cell j continues to receive the control signal causing the negative supply terminal of the TX driver 410 for cell j to be connected to the external negative supply node EXT.

In addition, during time T3, enable signal EN continues to cause switch 460 to isolate internal negative supply node INT from external supply node EXT.

In addition, ADC 460 generates a first digital voltage D0 encoding the initialization voltage at the ADC input node. Accordingly, first digital voltage D0 encodes the value Vdd-Vt, as discussed above with reference to FIGS. 2 and 3.

Because the negative supply terminal of the TX driver 410 for cell j is connected to the external negative supply node EXT, and the external negative supply node EXT is isolated from internal negative supply node INT, the unsettled voltage changes on the internal negative supply node INT caused by the TX driver 410 for cell i sinking current to the internal negative supply node INT during time T1 does not couple to cell j and consequently does not couple to the ADC input node. As a result, the first digital voltage D0 generated by ADC 460 is not corrupted by noise coupled from cell i to cell j.

During time T4, the multiplexor 420 connected to the TX driver 410 for cell j receives a control signal causing the negative supply terminal of the TX driver 410 for cell j to be connected to ground supply node gnd. Accordingly, the voltage at node TXj increases from the negative voltage value to ground during time T4. In addition, during time T4, the multiplexor 420 connected to the TX driver 410 for cell i continues to receive the control signal causing the negative supply terminal of the TX driver 410 for cell i to be connected to the internal negative supply node INT.

Furthermore, during time T4, enable signal EN continues to cause switch 460 to isolate internal negative supply node INT from external supply node EXT.

During time T5, cell j causes the voltage at the ADC input to change according to the voltage at the data node of cell j, as discussed above with reference to FIGS. 2 and 3. In addition, during time T5, enable signal EN continues to cause switch 460 to isolate internal negative supply node INT from external supply node EXT. Furthermore, during time T5, the multiplexor 420 connected to the TX driver 410 for cell j continues to receive the control signal causing the negative supply terminal of the TX driver 410 for cell j to be connected to ground supply node gnd, and the multiplexor 420 connected to the TX driver 410 for cell i continues to receive the control signal causing the negative supply terminal of the TX driver 410 for cell i to be connected to the internal negative supply node INT.

During time T6, the FD node of cell j is disconnected from the data node of cell j, as discussed above with reference to FIGS. 2 and 3.

Furthermore, during time T6, the multiplexor 420 connected to the TX driver 410 for cell j continues to receive the control signal causing the negative supply terminal of the TX driver 410 for cell j to be connected to ground supply node gnd, and the multiplexor 420 connected to the TX driver 410 for cell i continues to receive the control signal causing the negative supply terminal of the TX driver 410 for cell i to be connected to the internal negative supply node INT.

During time T7, the multiplexor 420 connected to the TX driver 410 for cell j receives a control signal causing the negative supply terminal of the TX driver 410 for cell j to be connected to the external negative supply node EXT. Accordingly, the voltage at node TXj decreases from the ground voltage to the negative voltage value of the external negative supply node EXT.

Furthermore, during time T7, the multiplexor 420 connected to the TX driver 410 for cell i continues to receive the control signal causing the negative supply terminal of the TX driver 410 for cell i to be connected to the internal negative supply node INT.

In addition, at time T7, enable signal EN continues to cause switch 460 to isolate internal negative supply node INT from external negative supply node EXT.

During time T8, the multiplexor 420 connected to the TX driver 410 for cell i continues to receive the control signal causing the negative supply terminal of the TX driver 410 for cell i to be connected to the internal negative supply node INT, and the multiplexor 420 connected to the TX driver 410 for cell j continues to receive the control signal causing the negative supply terminal of the TX driver 410 for cell j to be connected to the external negative supply node EXT.

Furthermore, during time T8, ADC 260 generates a second digital voltage D1 encoding the voltage at the ADC input node. Accordingly, second digital voltages D1 encodes the value Vdata−Vt, as discussed above with reference to FIGS. 2 and 3. In addition, during time T8, enable signal EN continues to cause switch 460 to isolate internal negative supply node INT from external supply node EXT.

Because the negative supply terminal of the TX driver 410 for cell j is connected to the external negative supply node EXT, and the external negative supply node EXT is isolated from internal negative supply node INT, the voltage changes on the internal negative supply node INT caused noise or delayed settling does not couple to cell j and consequently does not couple to the ADC input node. As a result, the second digital voltage D1 generated by ADC 460 is not corrupted by noise coupled to cell j through the negative supply terminal of the TX driver 410 for cell j.

A controller, not shown, may receive both first and second digital voltages D0 and D1, and may determine the image data of the illustrated read operation as a difference between first and second digital voltages D0 and D1.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An image sensor, comprising:
a plurality of image sensor cells, each configured to generate an image signal in response to a plurality of control signals;
an analog to digital converter (ADC), configured to receive the image signals of the image sensor cells;
a first driver configured to generate one or more first control signals for a first image sensor cell, wherein the first driver comprises a first negative supply terminal;
a first multiplexor configured to selectively connect the first negative supply terminal of the first driver to one of a plurality of power supply nodes;
a second driver configured to generate one or more second control signals for a second image sensor cell, wherein the second driver comprises a second negative supply terminal; and
a second multiplexor configured to selectively connect the second negative supply terminal of the second driver to one of the plurality of power supply nodes.

2. The image sensor of claim 1, wherein the plurality of power supply nodes comprises and a first negative supply node and a second negative supply node, wherein the voltage of the first negative supply node is less than or equal to the voltage of a ground node, and wherein the voltage of the second negative supply node is less than or equal to the voltage of the ground node.

3. The image sensor of claim 2, wherein the first multiplexer is configured to connect the first negative supply terminal of the first driver to the first negative supply node while the second multiplexer connects the second negative supply terminal of the second driver to the second negative supply node.

4. The image sensor of claim 2, wherein the first multiplexer is configured to connect the first negative supply terminal of the first driver to the first negative supply node while the first driver causes an image signal of a first image sensor cell to be provided to the ADC.

5. The image sensor of claim 4, wherein the first multiplexer is configured to connect the first negative supply terminal of the first driver to the first negative supply node while the first driver causes an image signal of a first image sensor cell to be provided to the ADC, and is configured to connect the first negative supply terminal of the first driver to the second negative supply node while the first driver causes the first image sensor cell to be reset.

6. The image sensor of claim 2, wherein the plurality of power supply nodes further comprises the ground node.

7. The image sensor of claim 6, wherein the first multiplexer is configured to connect the first negative supply terminal of the first driver to the ground node while the first driver transitions an output from a negative voltage value to a positive voltage value to cause an image signal of a first image sensor cell to be provided to the ADC.

8. The image sensor of claim 6, wherein the voltage of the first negative supply node is equal to the voltage of second negative supply node.

9. The image sensor of claim 6, wherein the second negative supply node is electrically connected to an external capacitor.

10. The image sensor of claim 6, further comprising a switch configured to selectively connect the first negative supply node to the second negative supply node.

11. A method of using an image sensor, the method comprising:
with each of a plurality of image sensor cells, generating an image signal in response to a plurality of control signals;
with an analog to digital converter (ADC), receiving the image signals of the image sensor cells;
with a first driver, generating the control signals for a first image sensor cell, wherein the first driver comprises a first negative supply terminal;
with a first multiplexor, selectively connecting the first negative supply terminal of the first driver to one of a plurality of power supply nodes;
with a second driver, generating the control signals for a second image sensor cell, wherein the second driver comprises a second negative supply terminal; and
with a second multiplexor, selectively connecting the second negative supply terminal of the second driver to one of the plurality of power supply nodes.

12. The method of claim 11, wherein the plurality of power supply nodes comprises and a first negative supply node and a second negative supply node, wherein the voltage of the first negative supply node is less than the voltage of a ground node, and wherein the voltage of the second negative supply node is less than the voltage of the ground node.

13. The method of claim 12, further comprising:
with the first multiplexer, connecting the first negative supply terminal of the first driver to the first negative supply node while the second multiplexer connects the second negative supply terminal of the second driver to the second negative supply node; and
with the first multiplexer, connecting the first negative supply terminal of the first driver to the second negative supply node while the second multiplexer connects the second negative supply terminal of the second driver to the first negative supply node.

14. The method of claim 12, further comprising:
with the first multiplexer, connecting the first negative supply terminal of the first driver to the first negative supply node while the first driver causes an image signal of a first image sensor cell to be provided to the ADC.

15. The method of claim 14, further comprising:
with the first multiplexer, connecting the first negative supply terminal of the first driver to the second negative supply node while the first driver causes the first image sensor cell to be reset.

16. The method of claim 12, wherein the plurality of power supply nodes further comprises the ground node.

17. The method of claim 16, further comprising with the first multiplexer, connecting the first negative supply terminal of the first driver to the ground node while the first driver transitions an output from a negative voltage value to a positive voltage value to cause an image signal of a first image sensor cell to be provided to the ADC.

18. The method of claim 16, wherein the voltage of the first negative supply node is equal to the voltage of second negative supply node.

19. The method of claim 16, wherein the second negative supply node is electrically connected to an external capacitor.

20. The method of claim 16, further comprising, with a switch, selectively connecting the first negative supply node to the second negative supply node.

* * * * *